United States Patent [19]
Kano et al.

[11] Patent Number: 4,567,364
[45] Date of Patent: Jan. 28, 1986

[54] METHOD AND APPARATUS FOR MEASURING DIMENSION OF SECONDARY ELECTRON EMISSION OBJECT

[75] Inventors: Masaaki Kano, Kamakura; Hiroshi Yamaji, Yokohama; Shinji Nakao, Yokohama; Katsuya Okumura, Yokohama, all of Japan

[73] Assignee: Tokyo Shibaura Denki Kabushiki Kaisha, Tokyo, Japan

[21] Appl. No.: 554,717

[22] Filed: Nov. 23, 1983

[30] Foreign Application Priority Data

Nov. 29, 1982 [JP] Japan ................ 57-207698

[51] Int. Cl.$^4$ .......................................... G01N 23/00
[52] U.S. Cl. .................................. 250/307; 250/310; 250/252.1
[58] Field of Search ............ 250/310, 252.1, 311, 250/397, 398, 307; 315/364, 386, 387

[56] References Cited

U.S. PATENT DOCUMENTS 4,039,829  8/1977  Kato et al. .................. 250/310

FOREIGN PATENT DOCUMENTS 56-105633  8/1981  Japan .

Primary Examiner—Bruce C. Anderson
Attorney, Agent, or Firm—Cushman, Darby & Cushman

[57] ABSTRACT

A dimension measuring apparatus for measuring the dimensions of a secondary electron emission object has a scanning electron microscope main body with a display, and a dimension measuring section connected to the main body. The dimension measuring section has a cursor setter for displaying cursors on the display. A memory stores image signals which are divided into picture elements and assigned to addresses. The image signals are used as image data. A CPU section receives the image data from the memory, obtains reference points for designating two ends of a line corresponding to a dimension of a sample to be measured based on the received image signals, and measures the dimension of the sample.

10 Claims, 15 Drawing Figures

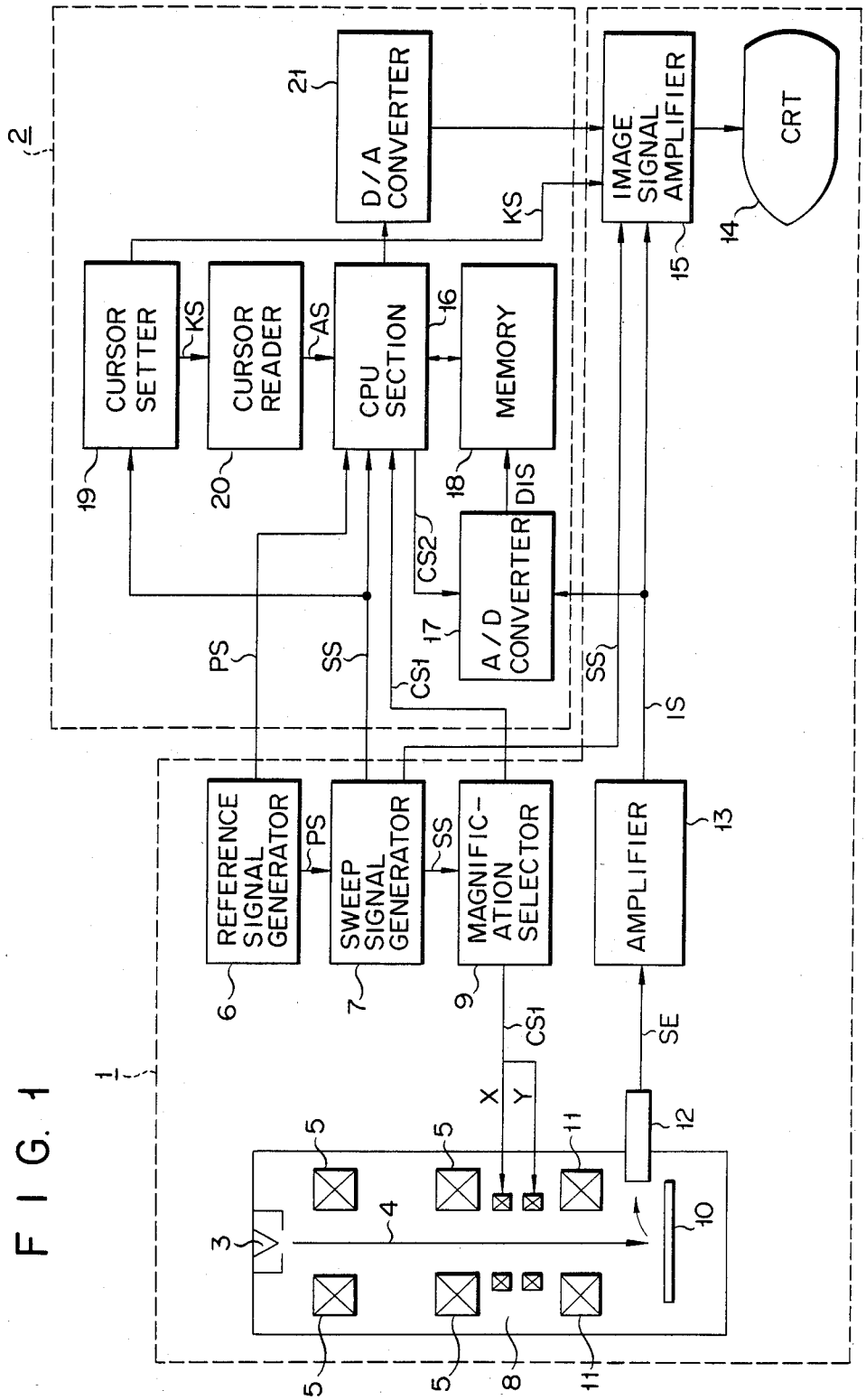
F I G. 1

METHOD AND APPARATUS FOR MEASURING DIMENSION OF SECONDARY ELECTRON EMISSION OBJECT

BACKGROUND OF THE INVENTION

The present invention relates to a method and apparatus for automatically measuring a dimension of an object onto which electron beam is radiated and which emits secondary electrons with high precision.

A conventional method and apparatus for measuring a small dimension or size is known. Such a small dimension includes a dimension of crystals of a metal, a dimension of an subgrain boundary, a dimension of a non-metallic inclusion in a metal, a dimension of an alloy phase, a powder particle size, a dimension of an IC mask pattern, a size of a CRT spot, a dimension of an insulating ceramic, a dimension of a color TV shadow mask, a pore size and a void size of an electrode coke, a gap dimension of a magnetic core, a gap dimension of a magnetic head and the like. An example of a pattern formed on a semiconductor wafer will be described hereinafter.

According to a conventional method for measuring a width of a photoresist pattern, a polysilicon pattern, a silicon nitride pattern and any other various types of pattern formed on a semiconductor wafer, an image of a pattern as an object to be measured is optically enlarged and measured using a micrometer with an optical microscope, electronic measuring equipment combining an industrial television and an optical microscope, or the like. According to another conventional method, a laser beam is irradiated onto a semiconductor wafer using a device comprising a combination of a laser and a precision-movable stage, and a width of a pattern is measured by measuring the intensity of reflected light and the amount of displacement of the stage.

According to still another conventional method, using a measuring device with a scanning electron microscope (to be referred to as SEM hereinafter), an enlarged image of a pattern of a semiconductor wafer is measured using a scale, and the width of the pattern is determined from the obtained measurement and the magnification of the SEM during the measurement. Still another conventional method is also known wherein an enlarged image of a pattern is divided into a plurality of picture elements, cursors are generated on a screen, the operator aligns the cursors at the edges of the pattern on the screen, and the dimension of the pattern to be measured is determined from the number of picture elements between the cursors and the magnification of the SEM. Still another conventional method is also described in Japanese Patent Disclosure No. 56-105633. According to this method, a signal obtained from the SEM and corresponding to the semiconductor wafer is compared with a critical discrimination level (threshold level). A point at which these two level coincide is determined to determine the width of a pattern to be measured. However, with a recent tendency toward higher packing density of LSIs and VLSIs, micropatterning and high precision patterning of a semiconductor wafer are becoming daily routines. For this reason, a higher resolution of a device for measuring a width of a semi-conductor pattern is required. More specifically, a resolution of $0.1\mu$ or greater is required. However, with the conventional method utilizing an optical microscope, the magnification is limited and limitation of the resolution is about ¼ the wavelength, both being unsatisfactory. With the conventional method utilizing a laser, high-precision measurement cannot be performed due to the resolution limit of a beam spot diameter of a laser, or variations caused by the difference between the resist pattern and the semiconductor pattern after etching. With the conventional method utilizing an SEM, a reading error is generated during measurement of a dimension of an enlarged image of a pattern using a scale. In the case of the conventional method of aligning cursors displayed on the screen with the edges of the enlarged image as a pattern to be measured, variations in alignment by different operators present a problem. In the conventional method wherein a level of a signal obtained from an SEM is compared with a critical discrimination level, the measurement results are different depending upon the setting of the critical discrimination level. Thus, a point at which the signal from the SEM starts changing or stops changing cannot be determined. That is an upper edge or a lower edge of the pattern can not be detected, so high-precision measurement cannot be performed.

SUMMARY OF THE INVENTION

The present invention has been made in consideration of this and has for its object to provide a method and apparatus for automatically measuring a small dimension of an object to be measured with high precision.

According to an aspect of the present invention, there is provided a method for measuring the dimensions of an object included in a sample, comprising the steps of:

scanning an electron beam onto the sample so as to obtain an image signal corresponding to the sample;

determining reference points for defining two ends of a line corresponding to the dimension of the object in accordance with the image signal obtained in said scanning step; and calculating the dimension of the object in accordance with the two reference points obtained in said determining step.

According to another aspect of the present invention, there is also provided an apparatus for measuring the dimensions of the object included in a sample, comprising:

a scanning electron microscope main body which scans an electron beam onto the sample so as to obtain an image signal corresponding to the sample, and which has a display section for displaying an enlaged image of the sample in accordance with the image signal;

a cursor setting section which is connected to said scanning electron microscope main body and which displays cursors in a desired form at said scanning electron miscroscope main body;

a memory section which is connected to said scanning electron microscope main body, which receives image signals which are divided into picture elements and assigned to addresses corresponding to the picture elements from said scanning electron microscope main body, and stores these received image signals as image data; and an arithmetic control section which is connected to said cursor setting section and said memory section, receives the image data stored in said memory section and corresponding to a region designated by the cursors displayed by said cursor setting section, determines reference points for designating two ends of a line corresponding to the dimension of the object in accordance with the received image data, and calculates the dimensions of the object in accordance with the reference points of the sample to be measured.

According to the method or apparatus according to the present invention as defined above, variations in obtained measurements due to slight differences between operations of operators, reading errors and the like are eliminated. Also, small dimensions can be automatically measured at high precision and at high speed with a high resolution of 0.01μ or higher.

When the method or apparatus of the present invention is applied to the checking of LSIs or VLSIs, checking can be performed with high reliability and with ease. As a result, semiconductor devices of a better quality can be manufactured at a higher yield. The method and apparatus of the present invention thus significantly contribute to the development of various manufacturing techniques for higher packing density and the determination of process conditions. The same applies to measurements of objects other than a pattern formed on a semiconductor wafer.

BRIEF DESCRIPTION OF THE DRAWINGS

FIG. 1 is a block diagram showing a configuration of a dimension measuring apparatus according to an embodiment of the present invention;

DETAILED DESCRIPTION OF THE PREFERRED EMBODIMENTS

Figure 2:
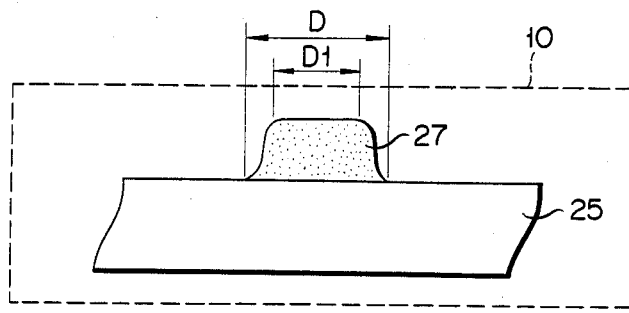
FIG. 2 is a view showing the configuration of a semiconductor wafer as an example of an object to be measured.

The preferred embodiments of the present invention will now be described with reference to the accompanying drawings.

FIG. 1 is a block diagram showing the configuration of a dimension measuring apparatus according to an embodiment of the present invention. The apparatus shown in FIG. 1 consists of a scanning electron microscope (SEM) main body 1, and a dimension measuring section 2 for measuring a dimension of a specific portion of a sample to be measured in accordance with data obtained from the SEM main body 1.

The SEM main body 1 has the following configuration. More specifically, the SEM main body 1 has an electron gun 3 for emitting an electron beam 4. A condenser lens 5 reduces the diameter of the electron beam 4 emitted from the electron gun 3. The SEM main body 1 also has a reference signal generator 6 for generating a clock signal PS. In accordance with the clock signal PS from the reference signal generator 6, a sweep signal generator 7 generates a sweep signal SS for raster scanning the electron beam 4. A magnification selector 9 produces a control signal CS1 for controlling a scanning coil 8 by combining the sweep signal SS and a magnification signal from a magnification selection switch (not shown). The control signal CS1 is supplied to a CPU section 16 to be described later. In accordance with the control signal CS1, the scanning coil 8 controls the scanning direction and width of the electron beam 4. The diameter of the electron beam 4 is further reduced by an objective lens 11, and the size-reduced electron beam 4 is radiated onto a semiconductor wafer 10. When the electron beam 4 is radiated onto the semiconductor wafer 10, secondary electrons are emitted at different rates from a silicon substrate and an aluminum pattern is formed thereon. A secondary electron detector 12 detects the secondary electrons and supplies to an amplifier 13 a signal SE corresponding to the amount of the detected secondary electrons. The amplifier 13 amplifies the signal SE and supplies amplified signal SE as a signal IS to an image signal amplifier 15. The image signal amplifier 15 supplies a signal to a cathode ray tube (CRT) 14. In accordance with the signal from the image signal amplifier 15, the CRT 14 displays an enlarged image of the specific portion of the semiconductor wafer 10.

The dimension measuring section 2 has a configuration as described below. More specifically, the dimension measuring section 2 has the CPU section 16 which produces a control signal CS2 for controlling the operation of an A/D converter 17 in accordance with the clock signal PS from the reference signal generator 6 and the sweep signal SS from the sweep signal generator 7.

The CPU section 16 has a CPU, a RAM, a ROM and the like, and has an arithmetic function and a memory function to be described later.

In response to the control signal CS2 from the CPU section 16, the A/D converter 17 converts an image signal IS from an amplifier 13 into divided image signals corresponding to a plurality of picture elements (512×512). The A/D converter 17 further converts the image signal IS, assigns addresses to the divided image signals, and produces resultant digital image signals DIS. The digital image signals DIS are obtained by sampling the image signal IS at timings determined by the control signal CS2 from the CPU section 16, and performing A/D conversion. A memory 18 stores the obtained digital image signals DIS.

The dimension measuring section 2 also has a cursor setter 19 for producing a cursor signal KS. The cursor signal KS is supplied to the CRT 14 through the image signal amplifier 15 to generate cursors on the CRT 14 and to move the displayed cursors. Setting and moving of the cursors can be performed with a cursor setter having a known joystick circuit (not shown) and a comparator, by generating a voltage from the joystick circuit and changing a point at which the voltage from the joystick circuit coincides with the voltage of the sweep signal SS from the sweep signal generator 7. In response to the cursor signal KS, a cursor reader 20 reads the positions of the cursors on the CRT 14 and produces address signals AS. The address signals AS are supplied to the CPU section 16 together with the clock signal PS, the sweep signal SS, and the control signal CS1 from the magnification selector 9.

The CPU section 16 performs various types of processing and storage to be described later in accordance with these signals. The arithmetic results obtained by the CPU section 16 are supplied to a D/A converter 21. The D/A converter 21 D/A converts the received arithmetic results from the CPU section 16 to an analog signal, and the obtained results are displayed at the CRT 14 through the image signal amplifier 15.

The mode of operation of the dimension measuring apparatus having the configuration as described above will now be described in detail.

The semiconductor wafer 10 consisting of the silicon substrate 25 and the aluminum pattern 27 is placed on the table of the SEM main body 1. FIG. 2 shows a section of the semiconductor wafer 10. The electron beam 4 emitted from the electron gun 3 is reduced in diameter by the condenser lens 5 and is raster-scanned in the X-Y directions by the scanning coil 8 in accordance with the control signal CS1 from the magnification selector 9. The electron beam 4 is further reduced in diameter by the objective lens 11 and is irradiated onto the semiconductor wafer 10. Then, the silicon substrate 25 and the aluminum pattern 27 of the semiconductor wafer 10 emit secondary electrons at different rates. The emitted secondary electrons are detected by the secondary electron detector 12 and are converted into electrical signals SE. The electrical signals SE from the secondary electron detector 12 are amplified by the amplifier 13 and are supplied to the image signal amplifier 15 as the image signals IS.

Figure 3:
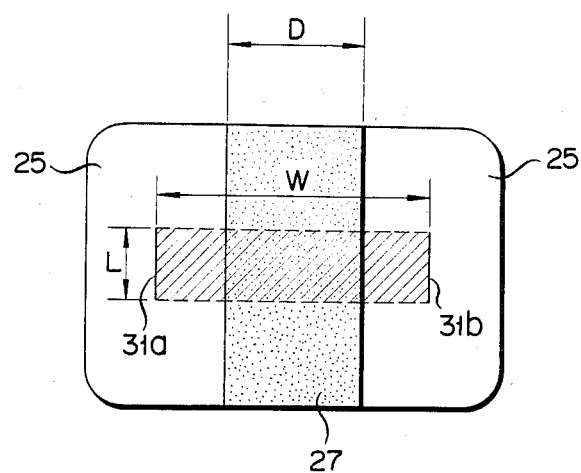
FIG. 3 is a view for explaining the setting of cursors on a CRT screen.
Figure 4:
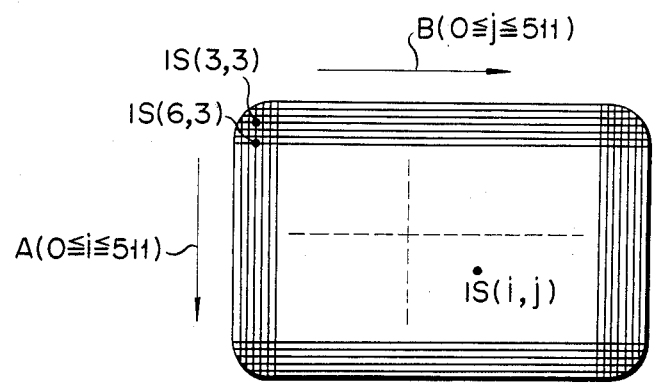
FIG. 4 is a view for explaining the division of an image signal obtained from the dimension measuring apparatus shown in FIG. 1 into picture elements.

The image signals IS from the amplifier 13 and the sweep signal SS from the sweep signal generator 7 are combined by the image signal amplifier 15 and are supplied to the CRT 14. The CRT 14 displays an enlarged image (FIG. 3) of a specific portion of the semiconductor wafer 10 in accordance with the output signals from the image signal amplifier 15. As shown in FIG. 4, the screen of the CRT 14 is divided into a matrix of 512×512 picture elements by raster scanning (along the direction indicated by arrow A in FIG. 4) and scanning line division (along the direction indicated by arrow B in FIG. 4). Each picture element is assigned an address IS (i, j) (0 ≦i, j ≦511), as shown in FIG. 4.

Meanwhile, the image signals IS from the amplifier 13 are sampled by the A/D converter 17 at a timing which is designated by the control signal CS2 from the CPU section 16, and are then divided into signals corresponding to the respective picture elements. The divided signals are assigned addresses IS(i, j) (0 ≦i, j ≦511), which correspond to the addresses of picture elements on the screen of the CRT 14, and are A/D converted. The resultant digital image signals DIS are stored in the memory 18.

Figure 5A:
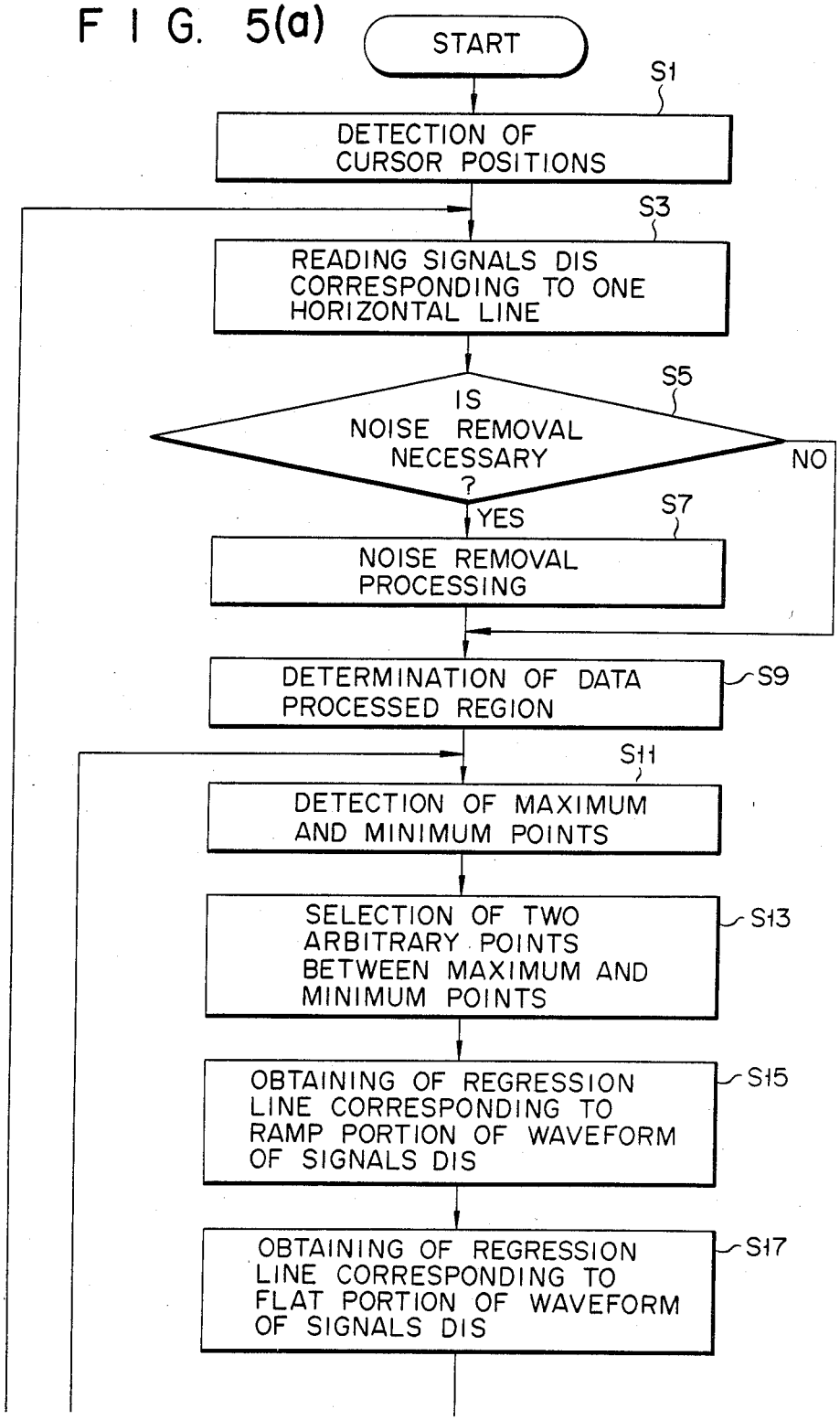
FIGS. 5(a) and 5(b) are flow charts for explaining the sequence of dimension measurement in the dimension measuring apparatus shown in FIG. 1.
Figure 5B:
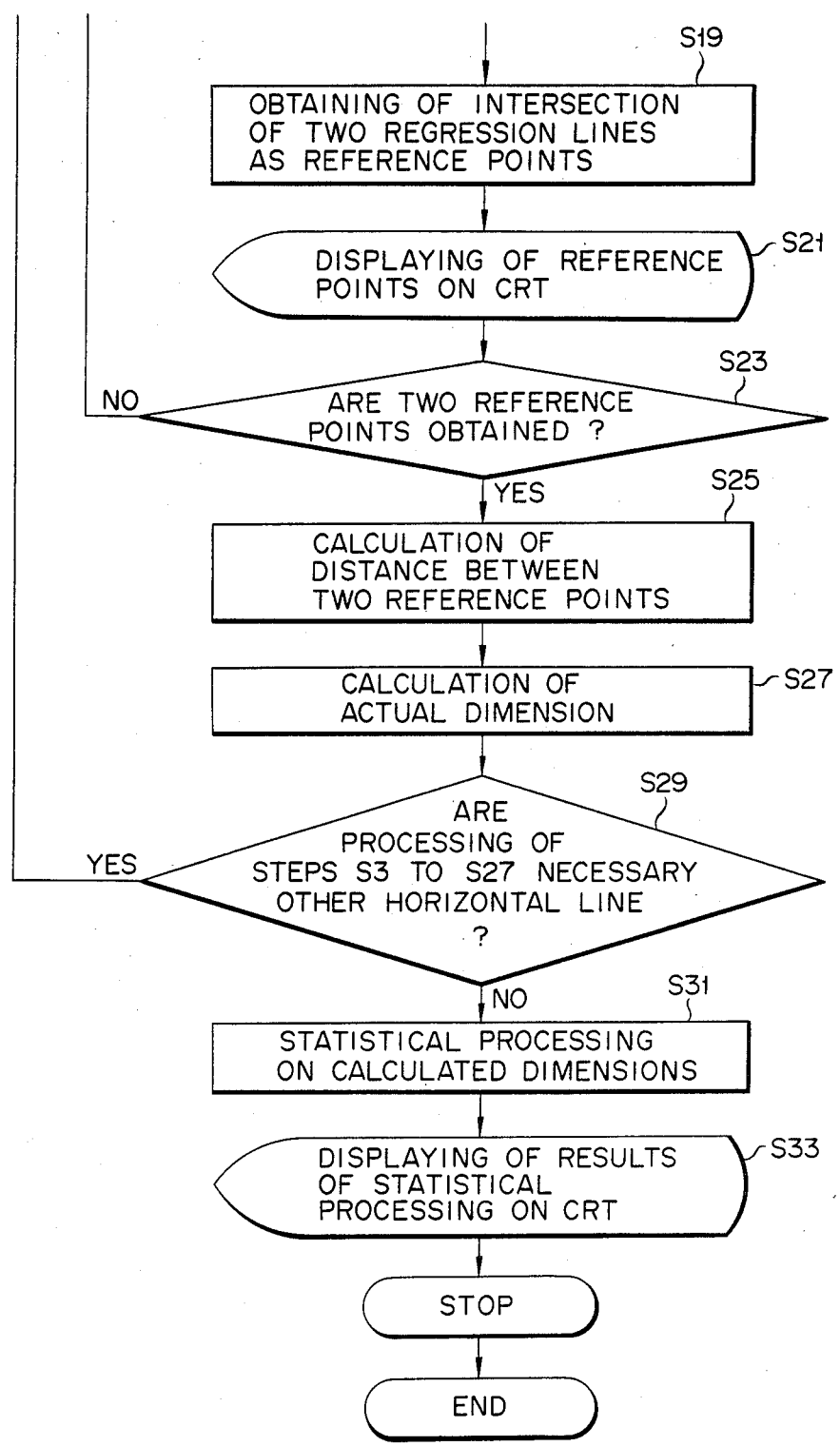

The step of measuring a width D of the aluminum pattern 27 of the semiconductor wafer in accordance with the enlarged image of the semiconductor wafer 10 displayed on the CRT 14 and various signals will be described with reference to the flow charts shown in FIGS. 5(a) and 5(b). First, the cursor setter 19 moves two cursors 31a and 31b to positions sandwiching the aluminum pattern 27 therebetween, as shown in FIG. 3. A distance W between the two cursors 31a and 31b and a length L of each cursor 31a or 31b can be adjusted at the cursor setter 19. The CPU section 16 detects the positions of the cursors 31a and 31b on the CRT 14 in accordance with the address signal AS from the cursor reader 20 (step S1). Then, a region for data processing is determined (a hatched region shown in FIG. 3).

Figure 6:
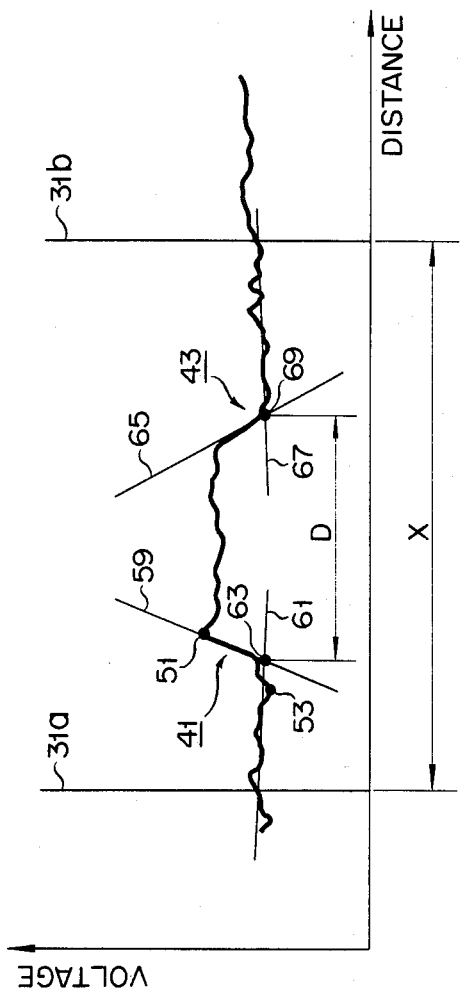
FIGS. 6 and 7 are views for explaining the determination of a pattern width.
Figure 7:
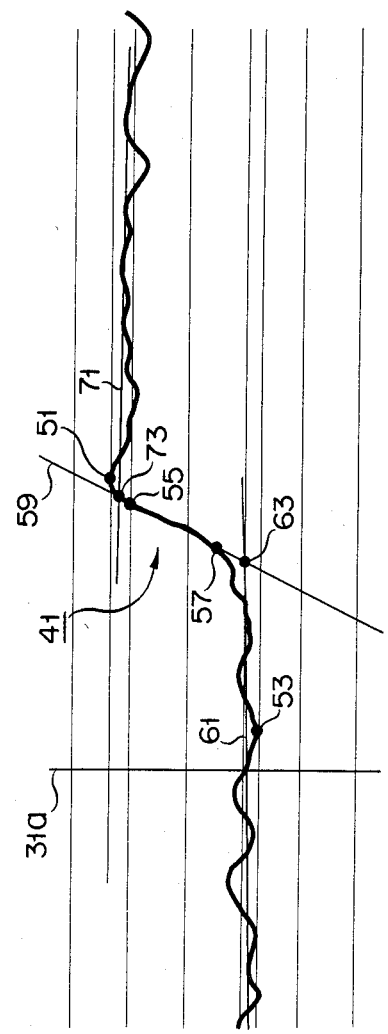

The CPU section 16 receives from the memory 18 the digital image signals DIS of one horizontal line within the region defined by the length of the cursors 31a and 31b (step S3). The one line digital image signals are subjected to noise removal processing by the FFT method or ARC (Accumulation Ramp Conversion) method to be described later, as needed (steps S5 and S7). The signals DIS obtained by such noise removal are shown in FIG. 6. In the waveform of the signal DIS shown in FIG. 6, the portion corresponding to the silicon substrate 25 of the semiconductor wafer 10 has a low voltage, and the portion corresponding to the aluminum pattern 27 has a high voltage. Then, the region to be processed and designated by the cursors 31a and 31b is determined (step S9). The data processing region is indicated by arrow X in FIG. 6. In FIG. 6, portions 41 and 43 of the signal DIS within the data processing region correspond to the edge portions of the aluminum pattern 27. FIG. 7 shows an enlarged view of a portion surrounding the portion 41. A point 51 of maximum value and a point 53 of minimum value in the vicinity of the portion 41 are detected (step S11). Two arbitrary points 55 and 57 between the points 51 and 53 are selected (step S13). In this embodiment, the point 55 is selected to be a point at which the signal level is 80% of the maximum value, and the point 57 is selected to be a point at which the signal level is 30% of the maximum value. A regression line 59 is obtained by the method of least squares in accordance with the data between the points 55 and 57, that is, the data of the signal ramp portion (step S15). Subsequently, a regression line 61 for the data between the points 53 and 57, that is, the data corresponding to the flat portion of the signal waveform, is obtained by the method of least squares (step S17). An intersection 63 of the regression lines 59 and 61 is obtained (step S19). This intersection 63 is given as one reference point. The data of the reference point 63 is supplied to the D/A converter 21 and is displayed on the CRT 14 (step S21). The same data is also stored in the memory 18. Likewise, regression lines 65 and 67 are obtained for the portion 43 (steps S23, S11 to S17). An intersection 69 of the regression lines 65 and 67 is calculated (step S19). The intersection 69 is defined as the other reference point for dimension measurement. The position of the point 69 is displayed on the CRT 14 (step S23). A distance between the two reference points is calculated (step S25). This distance can be easily obtained by counting the number of picture elements on the CRT 14. The distance between the reference points is multiplied by the dimension per picture element, which is determined by the magnification selector 9, to calculate an actual dimension between the reference points (step S27). The calculated distance is the dimension of width D of the aluminum pattern 27. Measurement of the width D of the aluminum pattern 27 on one horizontal line of the CRT 14 is completed in this manner. When the cursors 31a and 31b extend over a plurality of horizontal lines 31a and 31b, the same processing is repeated for the remaining lines as needed (step S29). Various statistical processing is performed on the dimension of the width D of the aluminum pattern 27 obtained for respective lines (step S31). The statistical processing includes average value calculation, standard deviation calculation and so on. The calculation results obtained are supplied to the CRT 14, a monitor device (not shown), a printer (not shown) and the like, for display or recording (step S33), through the D/A converter 21, as needed, and are also stored in the memory 18. In this manner, the width D of the aluminum pattern 27 is measured.

Figure 8:
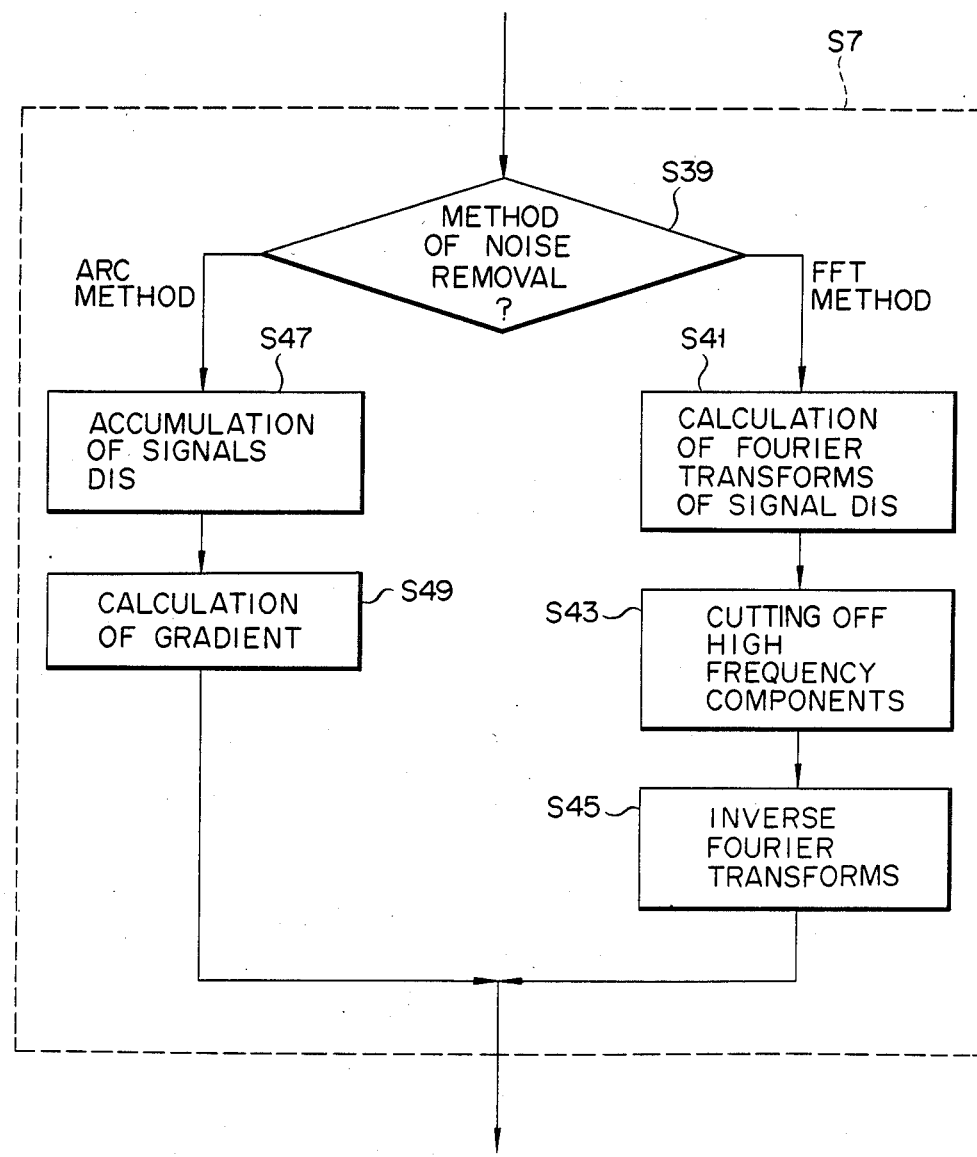
FIG. 8 is a flow chart for explaining a noise removal sequence.
Figures 9, 10:
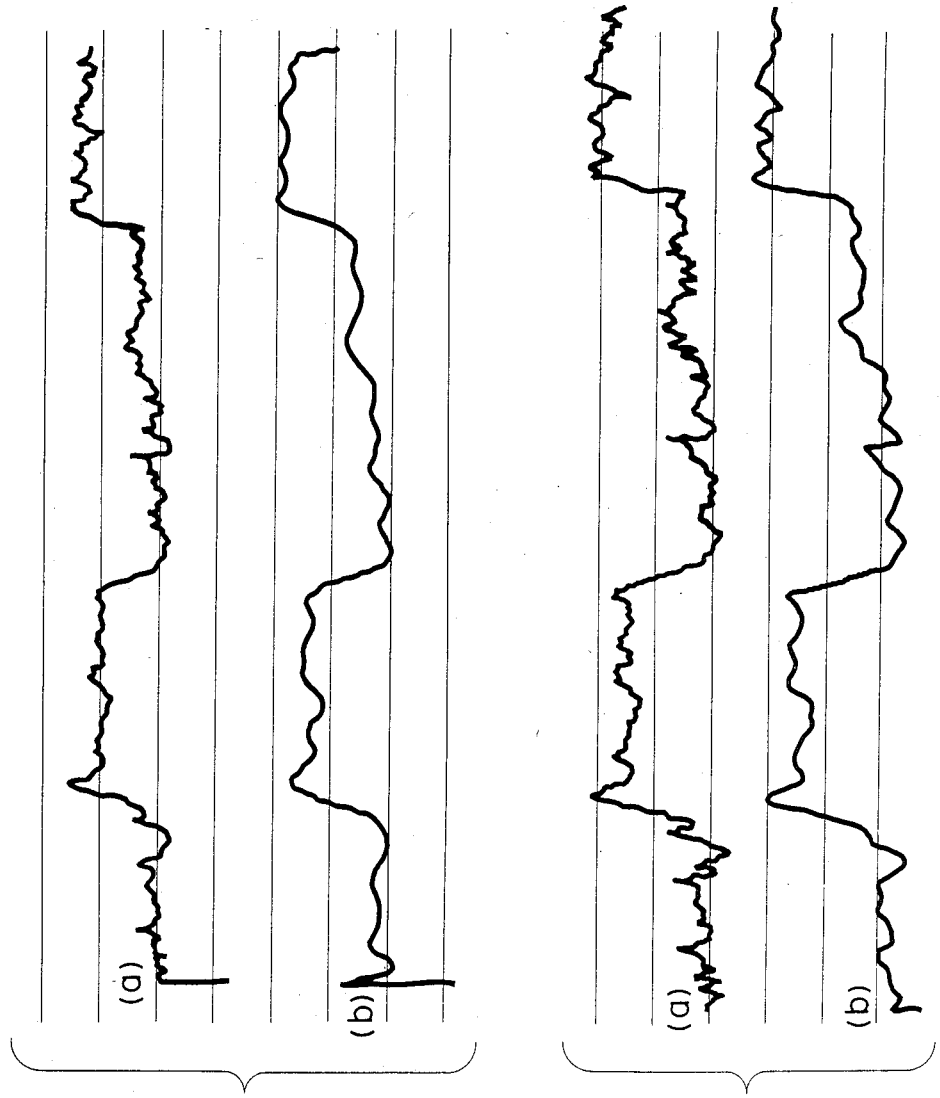
FIGS. 9 and 10 are views showing digital image signals before and after noise removal.

Noise removal as described above will now be described. If it is determined in step S5 in FIG. 5 that noise removal is necessary, noise removal is performed. FIG. 8 shows the steps for noise removal. In step S39 in FIG. 8, when the FFT (Fast Fourier Transform) method is selected as the noise removal method, the CPU section 16 calculates the Fourier transforms of the signals DIS read out from the memory 18 (step S41). Frequency analysis is then performed to cut off high-frequency components for noise removal (step S43). The data from which high-frequency components have been cut off are subjected to inverse Fourier transforming to obtain the original waveform (step S45). Upon these steps, the noise is removed from the original wave. This is shown in FIG. 9. FIG. 9(a) shows the signal waveform before noise removal, and FIG. 9(b) shows the same after noise removal. When the ARC method is selected in step S39 in FIG. 8, a calculation $$s(a) = \sum_{j=0}^{a} f(j)$$

(step S47) for $0 \leq a \leq 511$ is performed where f(j) is the data of a jth point ($0 \leq j \leq 511$) of one line of the signal DIS fetched from the memory 18. A ramp or slope $g(a) = (s(a+m)-s(a))/m$ is calculated with the data of the mth point ahead for the accumulation result s(a) (step S49). Upon this processing, the waveform from which the noise component is removed can be obtained as shown in FIG. 10. FIG. 10(a) shows the signal waveform before noise removal by the ARC method, and FIG. 10(b) shows the same after such noise removal. Noise removal is not limited to the above-mentioned methods. Same advantage can be obtained, for example, by averaging or adding plurality of image planes. When a width D1 of the pattern is measured as shown in FIG. 2, data corresponding to the high level of the signal waveform shown in FIG. 7 is subjected to the method of least squares to obtain a regression line 71 as shown in FIG. 7. An intersection 73 of the regression line 71 with the regression line 59 described above is given as a reference point for measurement. In some cases, reference points may be obtained from three or more regression lines. The reference point may, for example, be a mid-point between the intersections 63 and 73 or any one of points obtained by internally dividing the distance between the intersections 63 and 73 in a predetermined ratio. The method of calculating the regression lines is not limited to that described above. For example, data at points at predetermined ratios of the distance between the maximum and minimum points 51 and 53 may be obtained, and the regression line may then be calculated based on this data. It is therefore possible to select data having values within 10% from the minimum value within the range between the maximum and minimum values and to calculate regression lines of a flat portion of the signal waveform based on this data.

Figure 11:
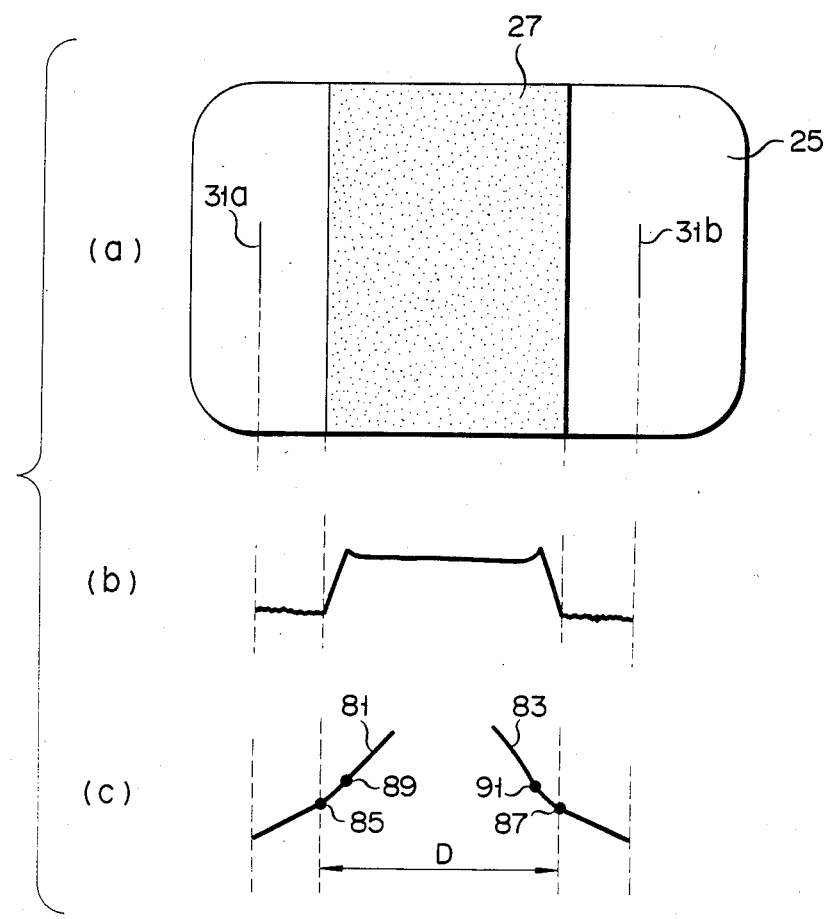
FIGS. 11 to 14 are views for explaining the measurement of various types of dimensions by the apparatus shown in FIG. 1.

The method for measuring the width of the aluminum pattern 27 is not limited to that in the embodiment described above wherein reference points are obtained from the intersections of regression lines and the width is measured in accordance with the reference points. For example, as shown in FIG. 11(a), the cursors 31a and 31b may be set to sandwich the aluminum pattern 27 therebetween. FIG. 11(b) shows the signal DIS for one horizontal line between the cursors 31a and 31b. The signal waveform shown in FIG. 11(b) is accumulated from each of the sides of the cursors 31a and 31b. Then, accumulation curves as shown in FIG. 11(c) are obtained. Inflection points 85 and 87 of the accumulation curves are defined as reference points. The distance between the reference points is calculated, and the width D of the aluminum pattern 27 as shown in FIG. 2 is measured from the magnification during measurement. The width D1 as shown in FIG. 2 can be measured by defining inflection points 89 and 91 as reference points. If required, similar processing may be repeated for any remaining horizontal line.

Figure 12:
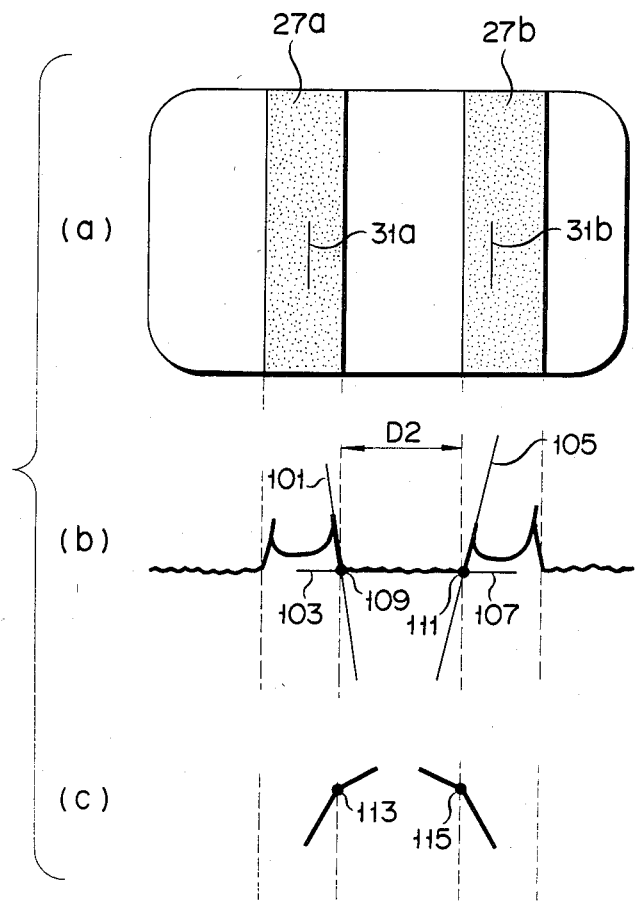

In this embodiment, a width of a pattern is measured. However, a length of a pattern can be similarly measured by rotating the scanning direction of an electron beam through 90° or rotating the generating directions of the cursors through 90°. Furthermore, the method and apparatus of the present invention is not limited to the measurement of a pattern dimension. For example, the cursors 31a and 31b may be set within two patterns 27a and 27b on the CRT 14, as shown in FIG. 12(a). Regression lines 101, 103, 105 and 107 are determined from the horizontal line signal waveform as shown in FIG. 12(b) in the same manner as in the above embodiment. Intersections 109 and 111 of the regression lines 101 and 103, and 105 and 107 are obtained, and are defined as reference points. Alternatively, a curve as shown in FIG. 12(c) is obtained by accumulating the waveform as shown in FIG. 12(b) from the sides of the cursors 31a and 31b, and inflection points 113 and 115 are defined as reference points. Then, the distance D2 between the patterns 27a and 27b can be determined from these reference points.

Figure 13:
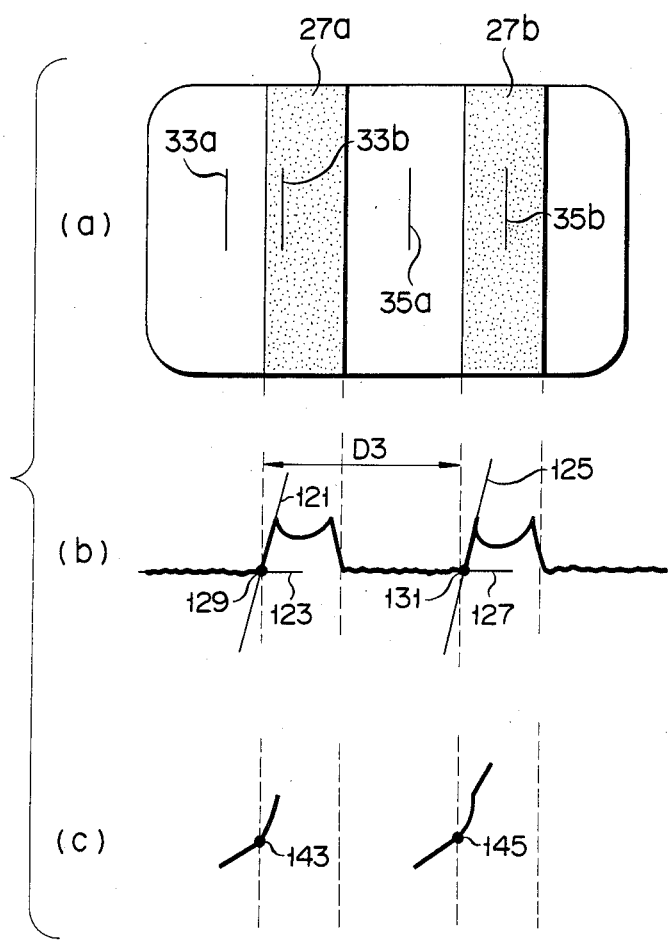

Still alternatively, a pitch D3 of the patterns 27a and 27b can also be measured, as shown in FIG. 13. Cursors 33a and 33b are generated to sandwich the left portion of the pattern 27a, while cursors 35a and 35b are generated to sandwich the left portion of the pattern 27b. In the same manner as in the above embodiment, regression lines 121, 123, 125 and 127 are obtained from the waveform shown in FIG. 13(b), and intersections 129 and 131 of these lines are calculated as reference points. Alternatively, the signal waveform shown in FIG. 13(b) may be accumulated from the left sides of the respective cursors 33a and 35a to obtain curves as shown in FIG. 13(c). Inflection points 143 and 145 are then defined as reference points. In either case, a pitch of the patterns D3 is obtained from the reference points.

Figure 14:
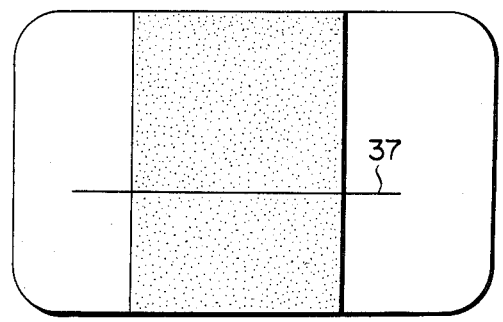

Data processing can also be performed for only one horizontal or vertical line corresponding to a cursor displayed on the CRT by generating a cursor 37 as shown in FIG. 14, thereby measuring the width of the pattern.

In the above embodiment, the number of picture elements was 512×512. However, it may be 1024×1024, for example.

In the above embodiment, a width of an aluminum pattern formed on a silicon substrate is measured. However, the method and apparatus of the present invention is not limited to this. For example, the method and apparatus of the present invention is similarly applicable to the measurement of the width or length of photoresist pattern, polysilicon pattern, silicon nitride pattern and any other types of patterns formed on semiconductor wafers. Moreover, the method and apparatus of the present invention can be applied to the measurement of the portions of any sample having a different amount of secondary electron emission, for example, a gap of a magnetic head, a size of an subgrain boundary, or the like. Therefore, the method and apparatus of the present invention can be applied to the measurement of any small dimension, particularly measurement on the order of under micrometers.

What is claimed is:

1. A method for measuring the dimensions of an object to be measured, which is included in a sample, comprising the steps of:

scanning an electron beam on the sample so as to obtain an image signal corresponding to the sample;

obtaining reference points defining two ends of a line corresponding to the dimension of the object in accordance with the image signal obtained in said scanning step by obtaining regression lines which in combination linearly calibrate a waveform of the image signal obtained in said scanning step by the method of least squares, and by determining the reference points based on intersections of the regression lines obtained in said step of obtaining the regression lines; and calculating the dimension of the object of the sample in accordance with the reference points obtained in said obtaining step.

2. A method for measuring the dimensions of an object to be measured, which is included in a sample, comprising the steps of:

scanning an electron beam on the sample so as to obtain an image signal corresponding to the sample;

obtaining reference points defining two ends of a line corresponding to the dimension of the object in accordance with the image signal obtained in said scanning step by accumulating a level of the image signal obtained in said scanning step to provide a series of cumulative values, and by determining the reference points in accordance with inflection points of the series of cumulative values obtained in said accumulating step; and calculating the dimension of the object of the sample in accordance with the reference points obtained in said obtaining step.

3. A method according to claim 1, further comprising the steps of:

displaying on display means an enlarged image, which comprises picture elements, of the sample based on the image signal obtained in said scanning step; and displaying at least one pair of cursors on said display means in superposition on the enlarged image of the sample in said step of displaying the enlarged image, the reference points being obtained in accordance with a portion of the image signal which corresponds to a region designated by said one cursor displayed in said step of displaying said at least one cursor.

4. A method according to claim 3, wherein said calculating step comprises the steps of:

calculating the number of picture elements between the reference points on the enlarged image of the object displayed in said step of displaying the enlarged image, in accordance with said determined reference points;

calculating a magnification with respect to the sample of the enlarged image of the sample obtained in said step of displaying the enlarged image; and calculating the dimensions of the object in accordance with the number of picture elements between the reference points obtained in said step of calculating the number of picture elements and in accordance with the magnification with respect to the sample of the enlarged image of the sample.

5. A method according to claim 1, wherein said determining step comprises the step of:

obtaining intersections of the regression lines obtained in said step of obtaining the regression lines, any two of the intersections being defined as the reference points.

6. A method according to claim 2, wherein said obtaining step comprises the step of:

obtaining inflection points of the series of cumulative values obtained in said accumulated step, any two of said inflection points being determined as the reference points.

7. A method according to claim 2, further comprising the steps of:

displaying on display means an enlarged image, which comprises picture elements, of the sample based on the image signal obtained in said scanning step; and displaying at least one pair of cursors on said display means in superposition on the enlarged image of the sample in said step of displaying the enlarged image, the reference points being obtained in accordance with a portion of the image signal which corresponds to a region designated by said at least one pair of cursors displayed in said step of displaying said at least one pair of cursors.

8. A method according to claim 7, wherein said calculating step comprises the steps of:

calculating the number of picture elements between the reference points on the enlarged image of the object displayed in said step of displaying the enlarged image, in accordance with said determined reference points;

calculating a magnification with respect to the sample of the enlarged image of the sample obtained in said step of displaying the enlarged image; and calculating the dimensions of the object in accordance with the number of picture elements between the reference points obtained in said step of calculating the number of picture elements and in accordance with the magnification with respect to the sample of the enlarged image of the sample.

9. An apparatus for measuring the dimensions of an object which is included in a sample comprising:

a scanning electron microscope main body for scanning the sample with an electron beam to obtain an image signal corresponding to the sample, said scanning electron microscope main body having a display section for displaying an enlarged image of the sample in accordance with the image signal;

a cursor setting section which is connected to said scanning electron microscope main body and which displays cursors in a desired manner on said scanning electron microscope main body;

a memory section which is connected to said scanning electron microscope main body, receives image signals which are divided into picture elements and assigned to addresses corresponding to the picture elements from said scanning electron microscope main body, and stores these image signals as image data; and an arithmetic control section which is connected to said cursor setting section and said memory section, receives the image data stored in said memory section and corresponding to a region designated by the cursors displayed by said cursor setting section, obtains the reference points which define two ends of a line corresponding to the dimensions of the object in accordance with the received image data, and calculates the dimensions of the object in accordance with the reference points.

10. An apparatus according to claim 9, further including an A/D converter which is connected to said scanning electron microscope main body and said memory section, which divides the image signal from said scanning electron microscope into picture elements, and which A/D converts the divided image signal, said memory section storing divided into picture elements by said A/D converter and A/D converted image signals as image data.

* * * * *

UNITED STATES PATENT AND TRADEMARK OFFICE
CERTIFICATE OF CORRECTION

PATENT NO. : 4,567,364

DATED : January 28, 1986

INVENTOR(S) : Masaaki Kano, Hiroshi Yamaji, Shinji Nakao, Katsuya Okumura

It is certified that error appears in the above-identified patent and that said Letters Patent is hereby corrected as shown below:

On the title page

Change "[73] Assignee: Tokyo Shibaura Denki Kabushiki Kaisha, Tokyo, Japan" to --[73] Assignee: Tokyo Shibaura Denki Kabushiki Kaisha, Kawasaki, Japan--.

Signed and Sealed this

Twenty-seventh Day of May 1986

[SEAL]

Attest:

Attesting Officer

DONALD J. QUIGG

Commissioner of Patents and Trademarks